United States Patent
Sawada et al.

(10) Patent No.: US 7,098,818 B1
(45) Date of Patent: Aug. 29, 2006

(54) ENCODER AND DECODER USING RUN-LENGTH-LIMITED CODE

(75) Inventors: Masaru Sawada, Kawasaki (JP); Toshio Ito, Kawasaki (JP); Toshihiko Morita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/166,978

(22) Filed: Jun. 24, 2005

(30) Foreign Application Priority Data

Mar. 31, 2005 (JP) ............................. 2005-104181

(51) Int. Cl.
*H03M 5/00* (2006.01)
*G06F 15/00* (2006.01)
*G06F 11/00* (2006.01)

(52) U.S. Cl. ..................... 341/58; 341/59; 341/63; 708/402; 708/203; 714/5

(58) Field of Classification Search ........... 341/58–65; 708/203, 401; 714/5
See application file for complete search history.

(56) References Cited

U.S. PATENT DOCUMENTS 6,564,237 B1 * 5/2003 Ohashi et al. .............. 708/490
6,690,308 B1 * 2/2004 Hayami ....................... 341/68
7,028,214 B1 * 4/2006 Takashi et al. ................ 714/5

FOREIGN PATENT DOCUMENTS

EP 0 751 522 1/1997
JP 2004-117239 4/2004

OTHER PUBLICATIONS

NN: "Rate 16/17 (0, 6/6) Code"; IBM Technical Disclosure Bulletin, IBM Corp, New York, vol. 31, No. 8; pp. 21-23; Jan. 1989.
Siegel et al.; "Modulation and Coding for Information Storage"; IEEE Communications Magazine, IEEE Service Center, Piscataway, NJ, vol. 20, No. 12; pp. 68-86; Dec. 1, 1991.

* cited by examiner

*Primary Examiner*—Lam T. Mai
(74) *Attorney, Agent, or Firm*—Greer, Burns & Crain, Ltd.

(57) ABSTRACT

When a zero run, which violating G constraint of a run-length-limited (RLL) code, is detected from the data stored in a first input register 1111 and a second input register 1112, bits before and after the zero run is transferred to a temporary register 1150 via a bus for zero run removal 1130 to be combined to each other. Thus, by effectively using the mechanism of bus transfer, a circuit can be simplified, thereby realizing a small circuit.

9 Claims, 21 Drawing Sheets

| ₁₀ | ₂₀ | ₃₀ | ₄₀ | ₅₀ |
|---|---|---|---|---|
| 1010001001 | 1000100000 | 0000000000 | 0000001101 | 0100011101 |

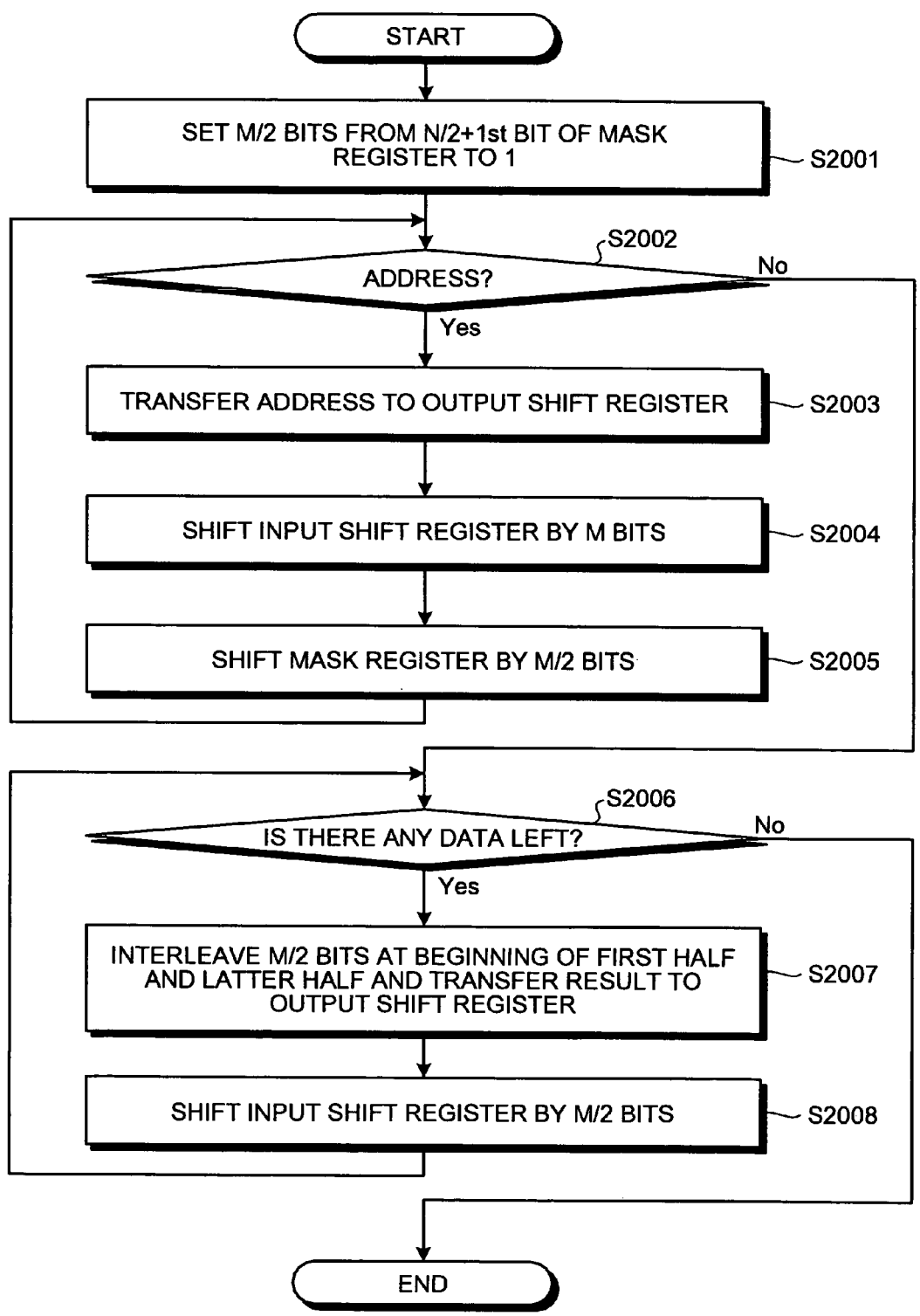

ENCODER AND DECODER USING RUN-LENGTH-LIMITED CODE

BACKGROUND OF THE INVENTION

1. Field of the Invention

The present invention relates to an encoder and a decoder using a run-length-limited (RLL) code.

2. Description of the Related Art

For improvement of recording density, data to be stored in/read from a recording medium (such as a magnetic disk or an optical disk) is encoded/decoded according to run length limited (RLL).

There are several types of RLL scheme, each having its own characteristics. For example, an encoding/decoding method disclosed in Japanese Patent Application No. 2004-117239 (filed by the present applicant) realizes a high code rate without violating G constraint and I constraint.

The encoding/decoding method is simple, however, the size of a circuit executing the encoding/decoding method can become large. This is because the encoder/decoder has to process parallel data (for example, 10-bit parallel data) to be stored in/read from the recording medium, while RLL originally assumes a bit string with no structure. Specifically, the encoder/decoder needs to be provided with a plurality of circuits, each corresponding to each bit pattern included in the parallel data. Furthermore, the encoder/decoder needs to perform various types of processing to satisfy a plurality of constraints, thereby further increasing the circuit size.

SUMMARY OF THE INVENTION

An encoder according to an aspect of the present invention, which encodes data using a run-length-limited code, includes a zero-run detecting unit that detects a zero run constituting a bit string and having a length longer than a predetermined length; and a zero-run removing unit that removes the zero run detected, by transmitting bits before and after the zero-run through a bus so that the bits are combined to each other.

A decoder according to another aspect of the present invention, which decodes data that is encoded using a run-length-limited code, includes a separating unit that separates an even bit and an odd bit from a bit string by transmitting the bit string through a bus.

A method according to still another aspect of the present invention, which is a method of encoding data using a run-length-limited code, includes: detecting a zero run constituting a bit string and having a length longer than a predetermined length; and removing the zero run detected, by transmitting bits before and after the zero-run through a bus so that the bits are combined to each other.

A method according to still another aspect of the present invention, which is a method of decoding data by using a run-length-limited code, includes separating an even bit and an odd bit from a bit string by transmitting the bit string through a bus.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 27 is a flowchart of the operation.

DETAILED DESCRIPTION OF THE PREFERRED EMBODIMENTS

Exemplary embodiments of the present invention will be explained in detail below with reference to the accompanying drawings.

The encoder according to the present embodiment executes the encoding method disclosed in Japanese Patent Application No. 2004-117239. The encoding method includes a substitution operation and an interleave operation to satisfy G constraint and I constraint, respectively. Therefore, in the following embodiments, a substitution apparatus performing the substitution operation and an interleave apparatus performing the interleave operation will be explained separately.

Furthermore, in the following embodiments, it is assumed that the encoder (including the substitution apparatus and the interleave apparatus) performs encoding with a constraint (0, G/I)=(0, 10/10) being satisfied. The constraint G=10 means that the maximum number of consecutive 0 is 10. The constraint I=10 means that the maximum number of consecutive 0 in even bits or odd bits is 10, respectively. The bit string of consecutive 0 that violates the G constraint is called "zero run".

Figure 1:
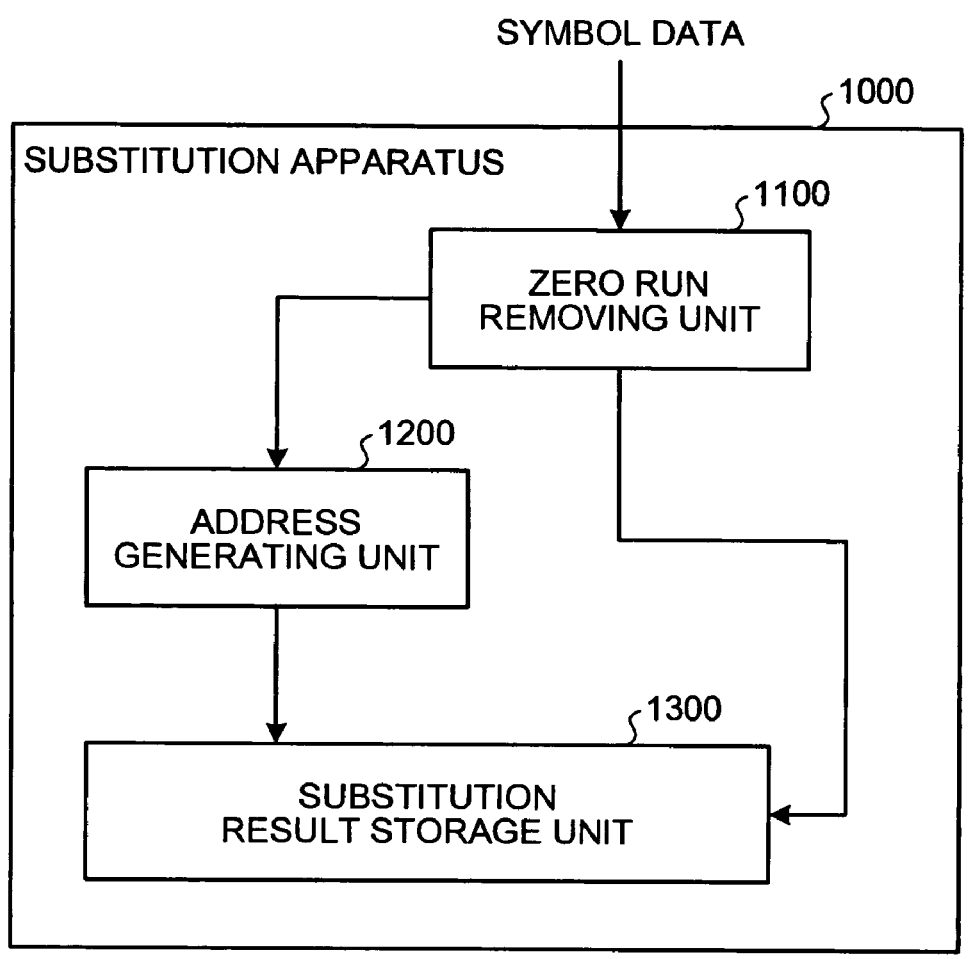
FIG. 1 is a block diagram of a substitution apparatus according to an embodiment of the present invention.

FIG. 1 is a block diagram of a substitution apparatus 1000 according to an embodiment of the present invention. The substitution apparatus 1000 substitutes the zero run by a code data called "address". The address is obtained by converting the count of a specific bit pattern (specifically, the bit pattern "10") preceding the zero run substituted by the address. The addresses are arranged collectively at the head of a substitution result of an input data (hereinafter, "symbol data").

The substitution apparatus 1000 includes a zero run removing unit 1100, an address generating unit 1200, and a substitution result storage unit 1300. The zero run removing unit 1100 is a processor that detects and removes the zero run included in the symbol data. The address generating unit 1200 is a processor that generates the address by counting the number of the "10" bit pattern included in the symbol data. The substitution result storage unit 1300 stores the substitution result, that is, the symbol data after the zero run being substituted by the address.

Figure 2:
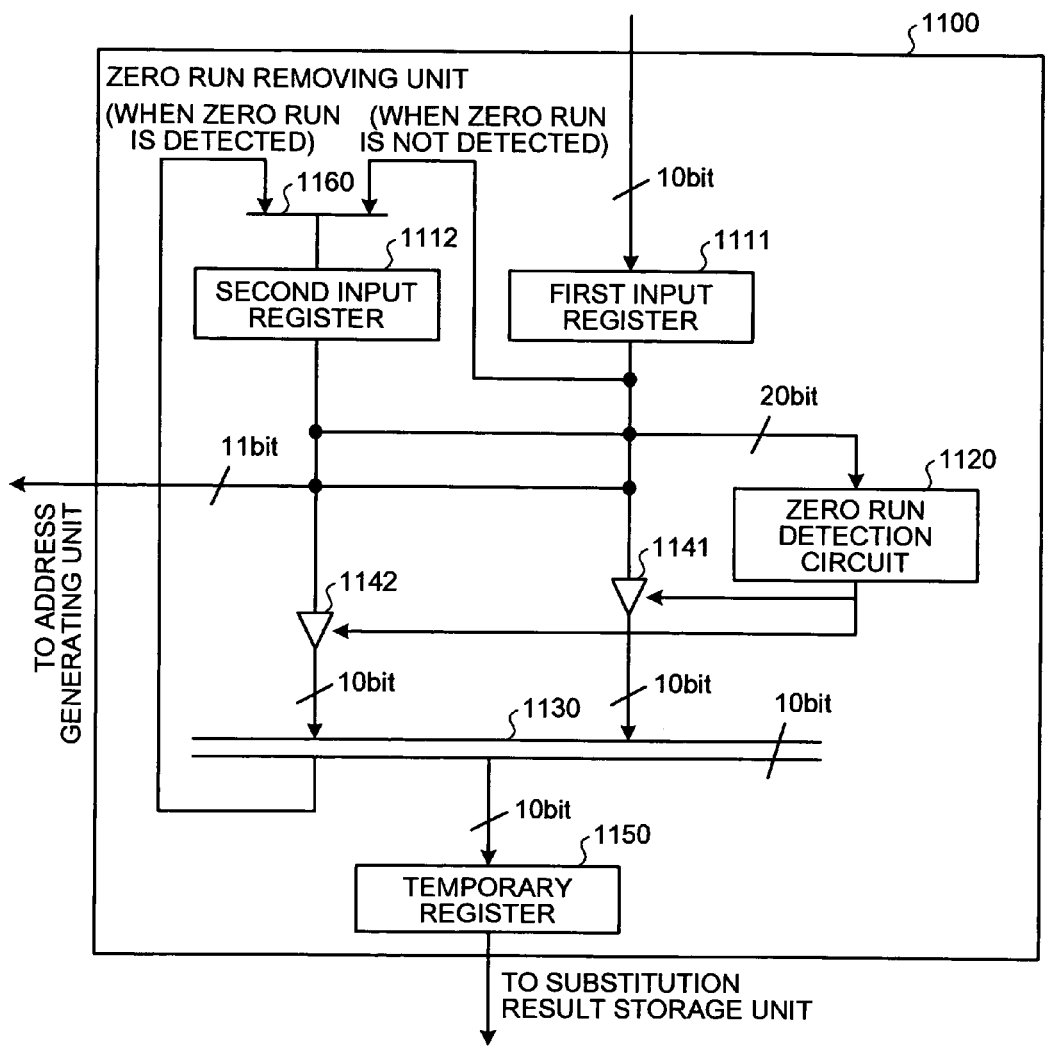
FIG. 2 is a block diagram of a zero run removing unit shown in FIG. 1.

FIG. 2 is a block diagram of the zero run removing unit 1100 shown in FIG. 1. The zero run removing unit 1100 includes a first input register 1111, a second input register 1112, a zero run detection circuit 1120, a bus for zero run removal 1130, bus drivers 1141 to 1142, a temporary register 1150, and a selector 1160.

The first input register 1111 stores the latest symbol data. The second input register 1112 stores the symbol data output from the first input register 1111 or the temporary register 1150. Both of the first input register 1111 and the second input register 1112 have a 10-bit width that is the same bit width as the symbol data.

The zero run detection circuit 1120 detects the zero run from a 20-bit data, which includes the data stored in the first input register 1111 as a high-order 10 bits and the data stored in the second input register 1112 as a low-order 10 bits, to satisfy the constraint G=10.

The bus for zero run removal 1130 transfers the data stored in the first input register 1111 or the second input register 1112 to the temporary register 1150. The bus driver 1141 controls the bus transfer from the first input register 1111 to the temporary register 1150. The bus driver 1142 controls the bus transfer from the second input register 1112 to the temporary register 1150.

Figure 3:
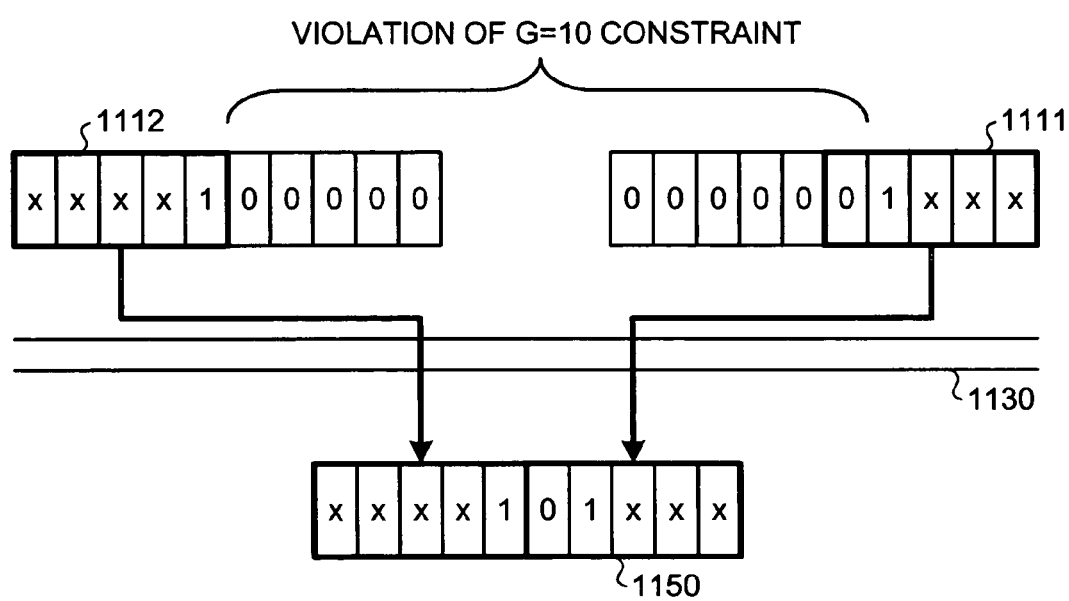
FIG. 3 is a diagram illustrating an operation performed by a bus included in the zero run removing unit.

FIG. 3 is a diagram illustrating an operation performed by the bus for zero run removal 1130. In FIG. 3, the low-order 5 bits of the second input register 1112 and the high-order 6 bits of the first input register 1111 are all 0 (in other words, 0 is consecutive for 11 bits). Therefore, the zero run detection circuit 1120 detects the zero run. The bus driver 1142 causes the bus for zero run removal 1130 to transfer only 5 bits preceding the zero run from the second input register 1112 to the temporary register 1150. On the other hand, the bus driver 1141 causes the bus for zero run removal 1130 to transfer only 5 bits following the zero run from the first input register 1111 to the temporary register 1150. Thus, the symbol data with the zero run being removed is stored in the temporary register 1150.

Without the bus for zero run removal 1130, since the zero run can start from any bit position of the second input register 1112, a plurality of data transfer circuits each corresponding to each bit pattern are required. The number of circuit also increases when the width of the first input register 1111 and the second input register 1112 becomes wider.

On the other hand, the substitution apparatus according to the present invention includes the bus that can change the transfer destination optionally, thereby reducing the circuit size. Furthermore, the substitution apparatus can respond to any change in the G constraint by only changing the width of the bus for zero run removal 1130.

The temporary register 1150 has a 10-bit width that is the same bit width as the symbol data, and temporarily stores data transferred thereto. When the zero run detection circuit 1120 does not detect the zero run, the data stored in the second input register 1112 is transferred as it is to the temporary register 1150.

The selector 1160 selects data to be input to the second input register 1112. When the zero run detection circuit 1120 does not detect the zero run, the selector 1160 causes the data from the first input register 1111 to be input to the second input register 1112. On the other hand, when the zero run detection circuit 1120 detects the zero run, the selector 1160 causes the data from the bus for zero run removal 1130 to be input to the second input register 1112. This is because the bits following the zero run, which has been removed while passing through the bus for zero run removal 1130, can constitute a part of another zero run.

Figure 4:
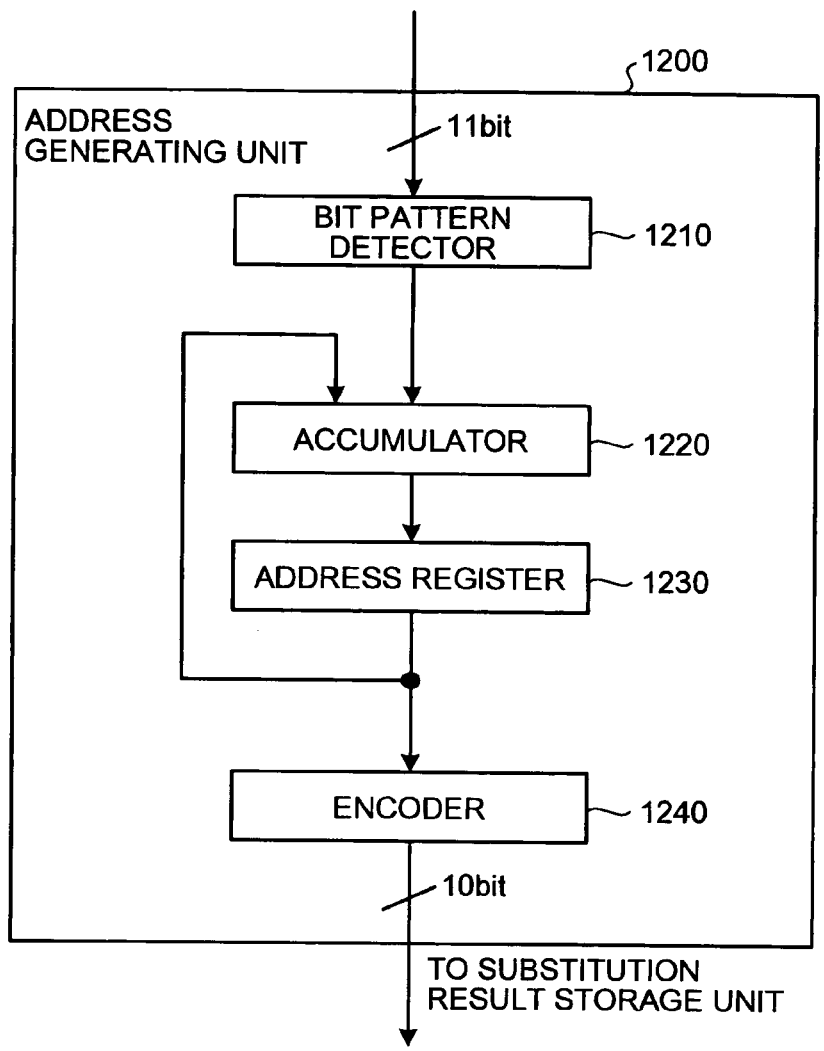
FIG. 4 is a block diagram of an address generating unit shown in FIG. 1.

FIG. 4 is a block diagram of the address generating unit 1200 shown in FIG. 1. The address generating unit 1200 includes a bit pattern detector 1210, an accumulator 1220, an address register 1230, and an encoder 1240.

The bit pattern detector 1210 is a circuit for detecting the number of "10" bit patterns from a 11-bit data, which includes the lowest order bit of the data stored in the second input register 1112 and the 10-bit data stored in the first input register 1111. This is because the "10" bit pattern can start from the lowest order bit of data stored in the second input register 1112.

The accumulator 1220 is an adder that adds the number of "10" bit patterns currently detected by the bit pattern detector 1210 to that detected before. The address register 1230 stores the result of addition performed by the accumulator 1220, that is, a cumulative total number of "10" bit patterns.

The encoder 1240 is a processor that generates the address by converting the cumulative total number stored in the address register 1230 according to a predetermined rule.

Figure 5:
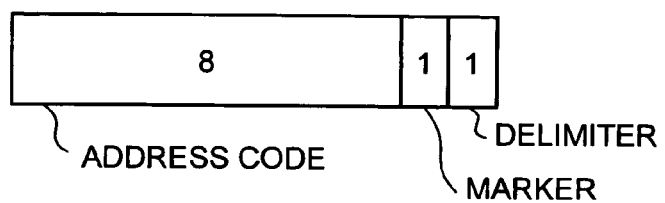
FIG. 5 is a diagram illustrating the format of an address generated by the address generating unit.

FIG. 5 is a block diagram illustrating the format of the address generated by the address generating unit 1200. The address includes an 8-bit address code, a 1-bit marker, and a 1-bit delimiter. The address code indicates the result of conversion of the cumulative total number of the "10" bit patterns. The marker "1" indicates that the subsequent data has not been subjected to the interleave operation. The marker "0" indicates that the subsequent data has been subjected to the interleave operation. The delimiter "1" indicates that it is followed by the symbol data. The delimiter "0" indicates that it is followed by another address.

Figures 6, 7:
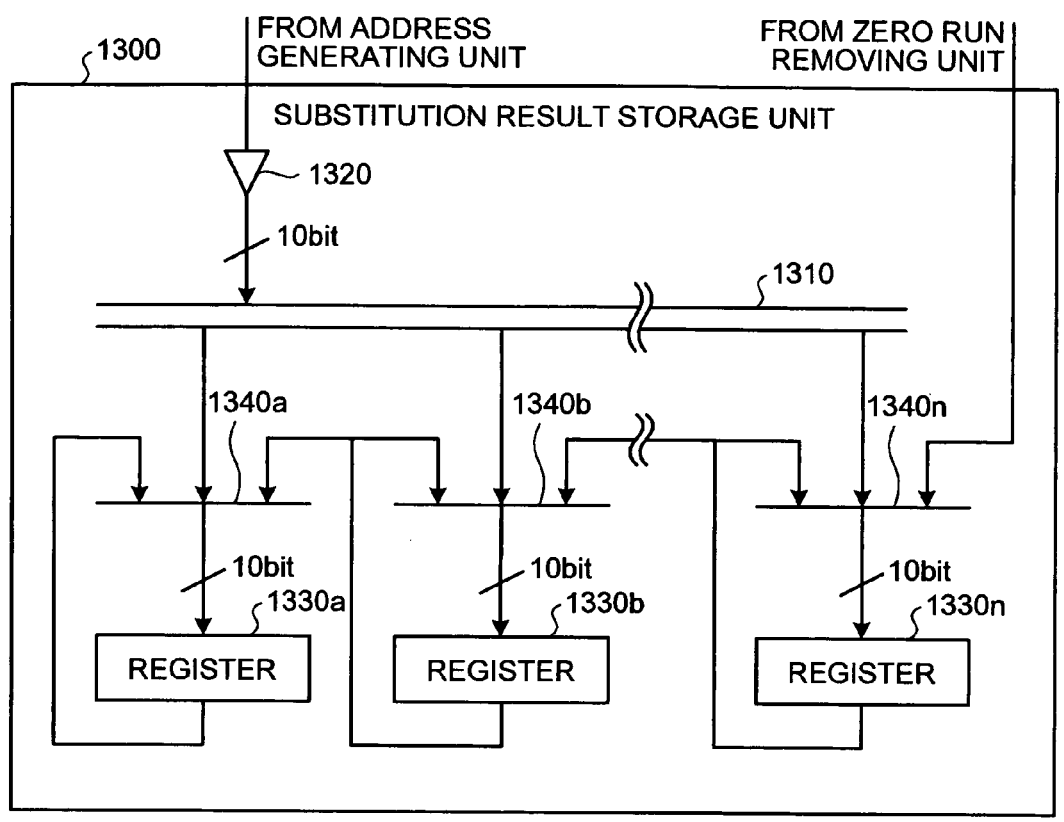
FIG. 6 is a block diagram of a substitution result storage unit shown in FIG. 1.
FIG. 7 is a diagram illustrating a symbol data to be input to the substitution apparatus.

FIG. 6 is a block diagram of the substitution result storage unit 1300 shown in FIG. 1. The substitution result storage unit 1300 includes an address bus 1310, a bus driver 1320, a plurality of registers 1330a to 1330n, and a plurality of selectors 1340a to 1340n. The number of the registers 1330a to 1330n and the selectors 1340a to 1340n is not limited to three as shown in FIG. 6.

The address bus 1310 transfers the address generated by the address generating unit 1200 to any one of the registers 1330a to 1330n, when the zero run is detected by the zero run removing unit 1100. The bus driver 1320 controls the address bus 1310.

According to the encoding method disclosed in Japanese Patent Application No. 2004-117239, it is necessary to sequentially add the address from the head of the substitution result. Therefore, the address bus 1310 changes the register to which the address is to be transferred, every time the zero run removing unit 1100 detects the zero run.

Without the address bus 1310, a plurality of data transfer circuits each corresponding to each register are required. On the other hand, the substitution apparatus according to the present invention includes the bus that can change the transfer destination optionally, thereby reducing the circuit size. Furthermore, the substitution apparatus can respond to any change in the data size to be stored in the substitution result storage unit 1300, by only changing the number of pairs of the registers 1330a to 1330n and the selectors 1340a to 1340n.

The registers 1330a to 1330n have a 10-bit width the same bit width as the symbol data, and function as a large buffer as a whole. When the zero run is detected by the zero run removing unit 1100, the buffer stores the addresses generated by the address generating unit 1200 in order from the head. When the zero run is not detected by the zero run removing unit 1100, the buffer stores the data in the temporary register 1150 of the zero run removing unit 1100 in order from the end, with the data stored therein being left-shifted.

The selectors 1340*a* to 1340*n* are selectors that select data to be input to the corresponding register. When the zero run removing unit 1100 detects the zero run, the selectors 1340*a* to 1340*n* causes the address from the address bus 1310 to be input to the corresponding registers 1330*a* to 1330*n*.

When the zero run removing unit 1100 does not detect the zero run, the selector 1340*n* causes the data stored in the temporary register 1150 to be input to the corresponding register 1330*n*. At the same time, the selectors 1340*a* to 1340*m* respectively causes the data stored in the registers 1330*b* to 1330*n* to be input to the corresponding registers 1330*a* to 1330*m* (assume that the address is not stored in any one of the registers 1330*a* to 1330*n*), thereby left-shifting the data stored in the buffer.

FIG. 7 is a diagram illustrating the symbol data to be input to the substitution apparatus. FIGS. 8 to 15 are diagrams for explaining an operation performed by the substitution apparatus 1000 when the symbol data 10 to 50 shown in FIG. 7 are input.

Figure 8:
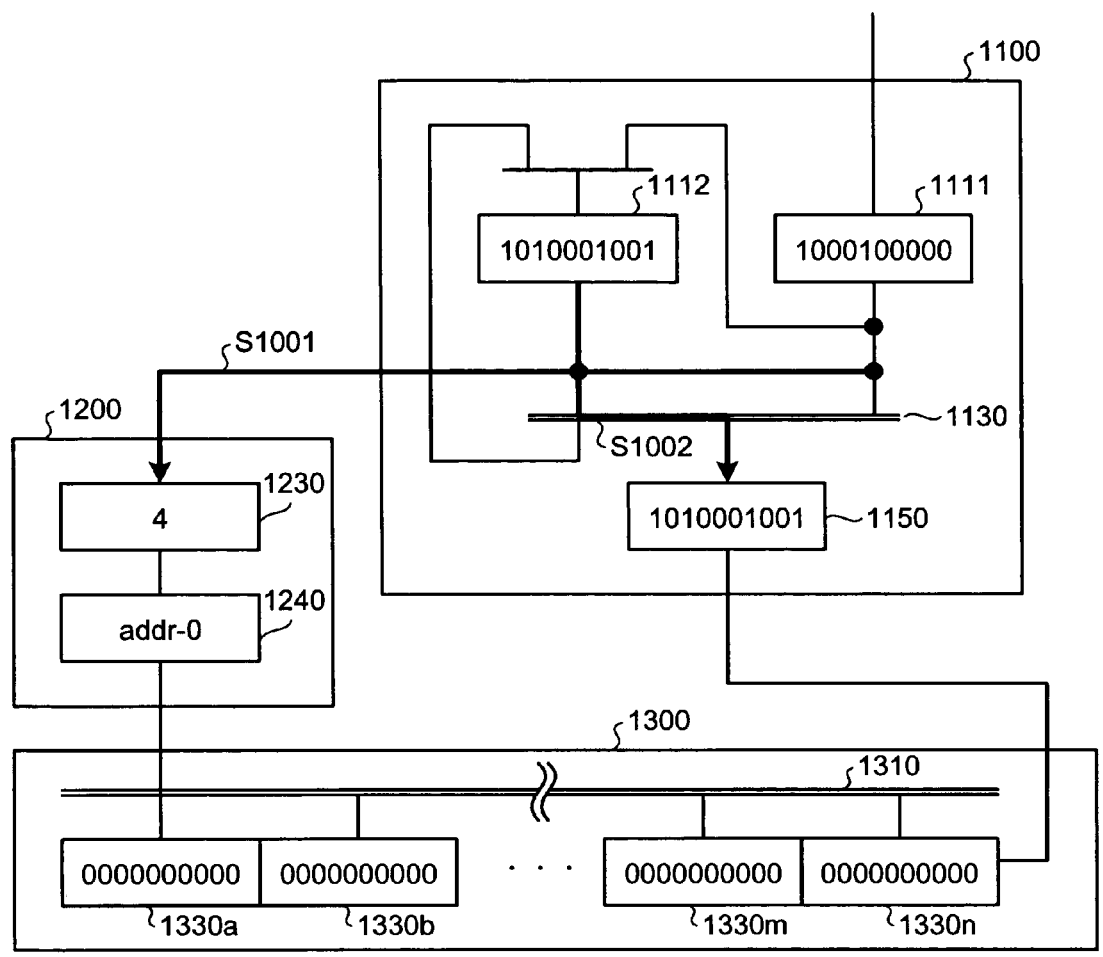
FIGS. 8 to 15 are diagrams for explaining an operation performed by the substitution apparatus.

When the symbol data 10 followed by the symbol data 20 is input to the substitution apparatus 1000 as shown in FIG. 8, the cumulative total number of "10" bit patterns, which is stored in the address register 1230 of the address generating unit 1200, is updated from "0" (initial value) to "4" (step S1001). In this case, since the zero run detection circuit 1120 does not detect the zero run, the data stored in the second input register 1112 is transferred to the temporary register 1150 via the bus for zero run removal 1130 (step S1002).

Figure 9:
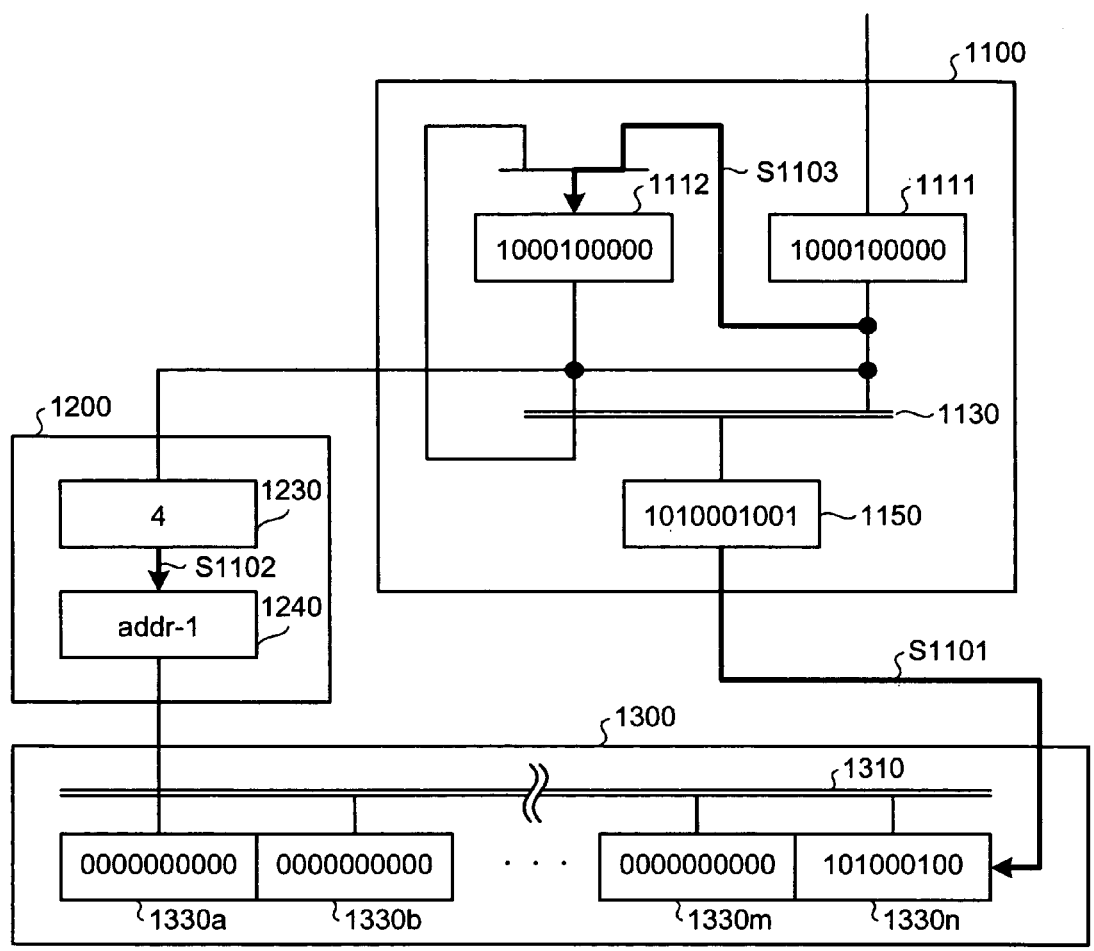

As shown in FIG. 9, the data is further transferred to the register 1330*n* (step S1101). On the other hand, in the address generating unit 1200, the encoder 1240 newly generates an address of addr-1 in response to the update of the cumulative total number stored in the address register 1230 (step S1102). Then, the data stored in the first input register 1111 is transferred to the second input register 1112 (step S1103).

Figure 10:
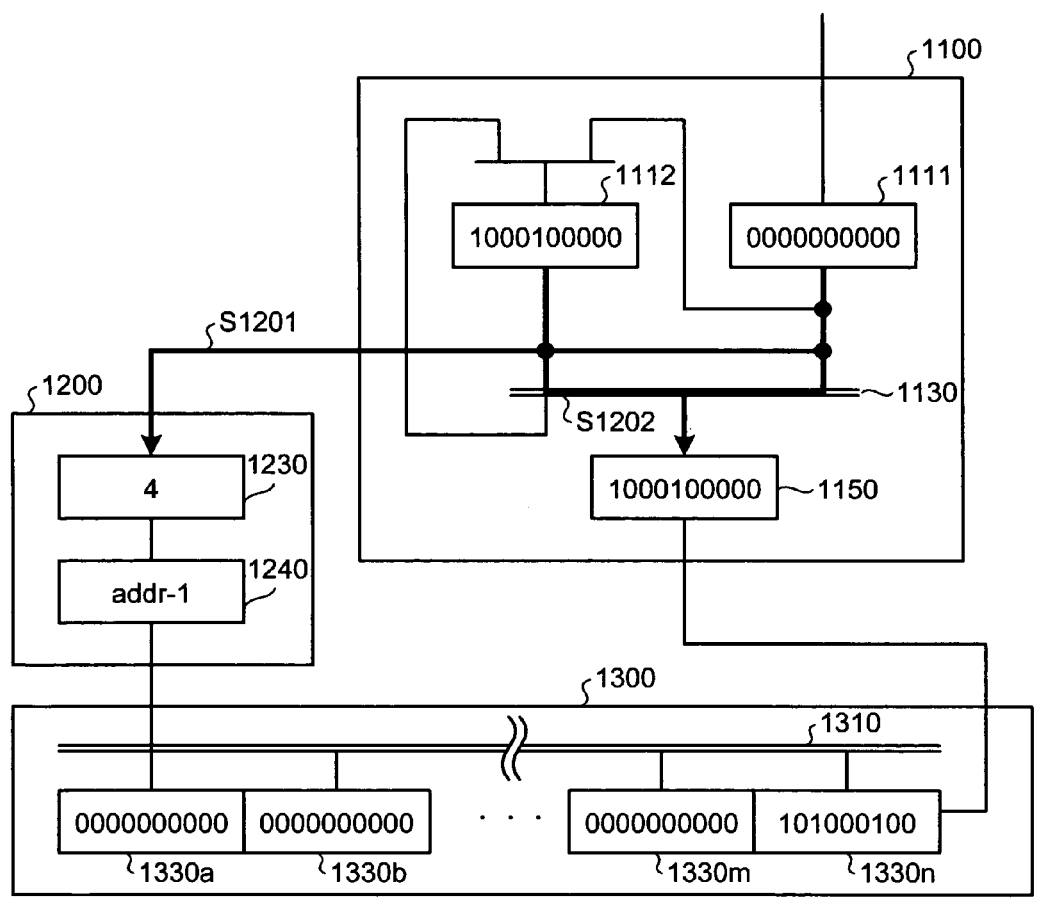

When the symbol data 30 is input as shown in FIG. 10, the cumulative total number stored in the address register 1230 remains as 4 (step S1201), since the 11-bit data, which consists of the lowest order bit of the second input register 1112 and the 10-bit data stored in the first input register 1111, does not include the "10" bit pattern at all. In this case, since the zero run detection circuit 1120 detects the zero run, the data stored in the first input register 1111 and the data stored in the second input register 1112 are transferred to the temporary register 1150 via the bus for zero run removal 1130 (step S1202).

Figure 11:
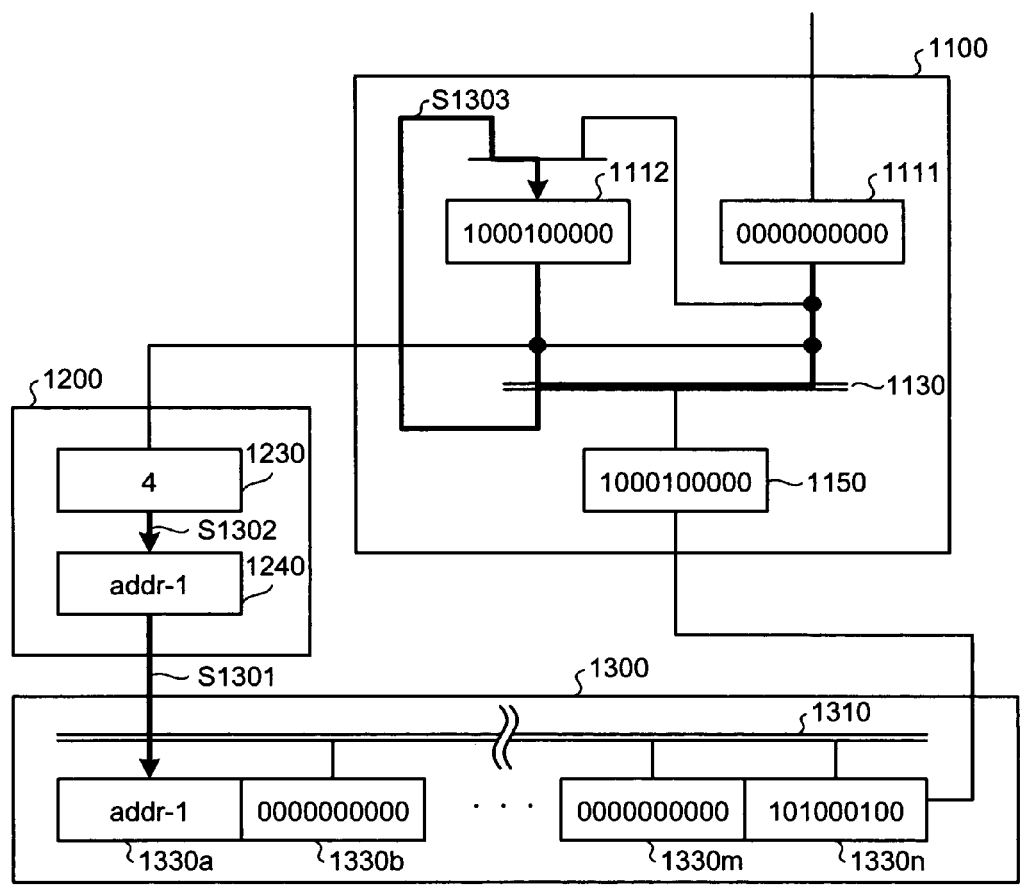

Subsequently, as shown in FIG. 11, an address of addr-1 generated by the encoder 1240 is transferred to the register 1330*a* via the address bus 1310 (step S1301). Since the cumulative total number stored in the address register 1230 has not yet been updated, the address generated by the encoder 1240 remains the same as addr-1 (step S1302). On the other hand, data after passing through the bus for zero run removal 1130 is also transferred to the second input register 1112 (step S1303).

Figure 12:
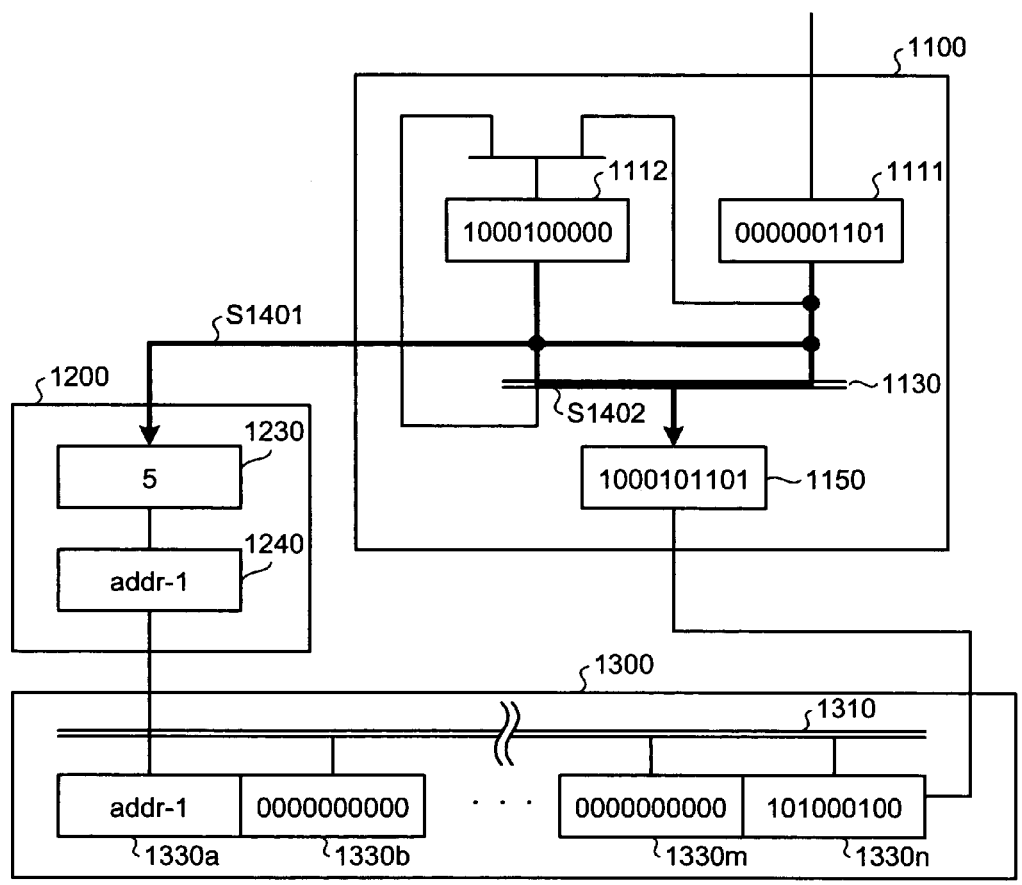

When the symbol data 40 is input as shown in FIG. 12, the cumulative total number stored in the address register 1230 is updated to "5" (step S1401). In this case, since the zero run detection circuit 1120 detects the zero run again, the data stored in the first input register 1111 and the data stored in the second input register 1112 are transferred to the temporary register 1150 via the bus for zero run removal 1130 (step S1402).

Figure 13:
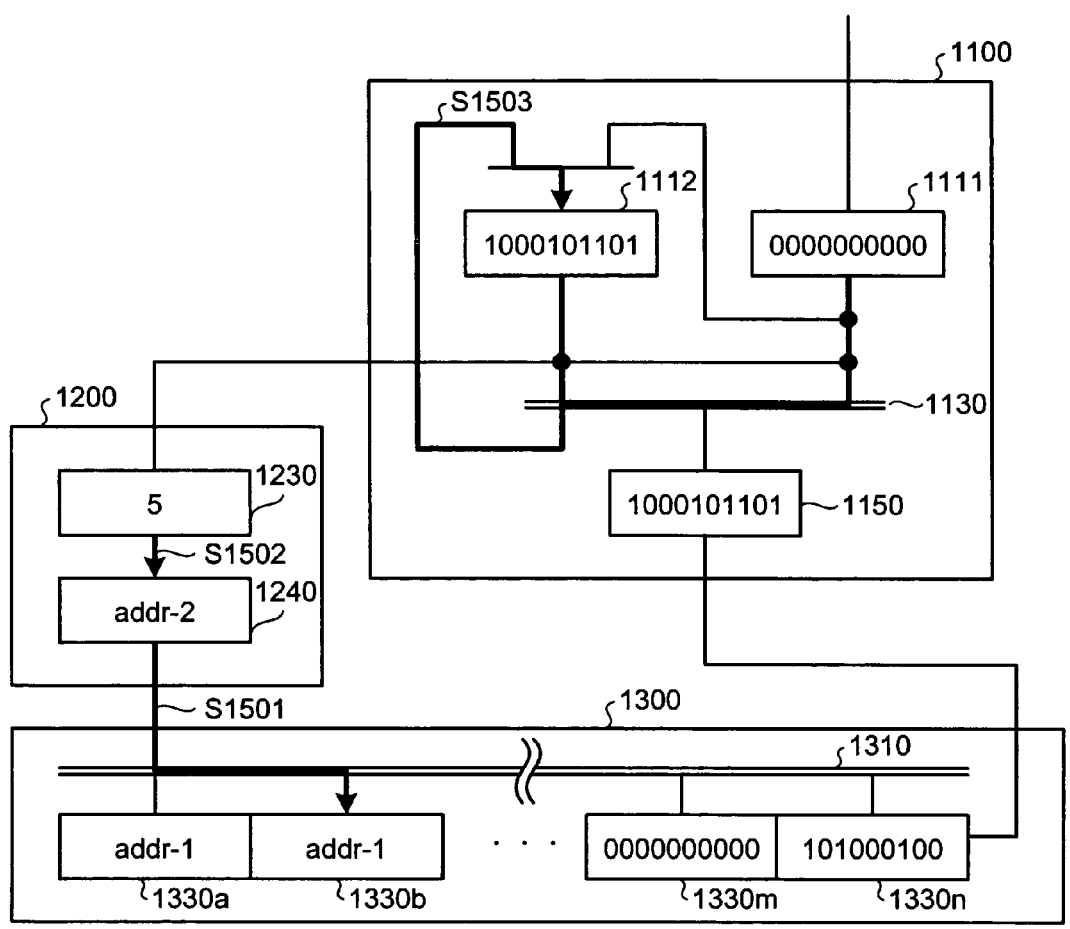

Subsequently, as shown in FIG. 13, an address of addr-1 generated by the encoder 1240 is transferred to the register 1330*b* via the address bus 1310 (step S1501). Since the cumulative total number stored in the address register 1230 has been updated, the encoder 1240 generates an address of addr-2 (step S1502). On the other hand, data after passing through the bus for zero run removal 1130 is also transferred to the second input register 1112 (step S1503).

Figure 14:
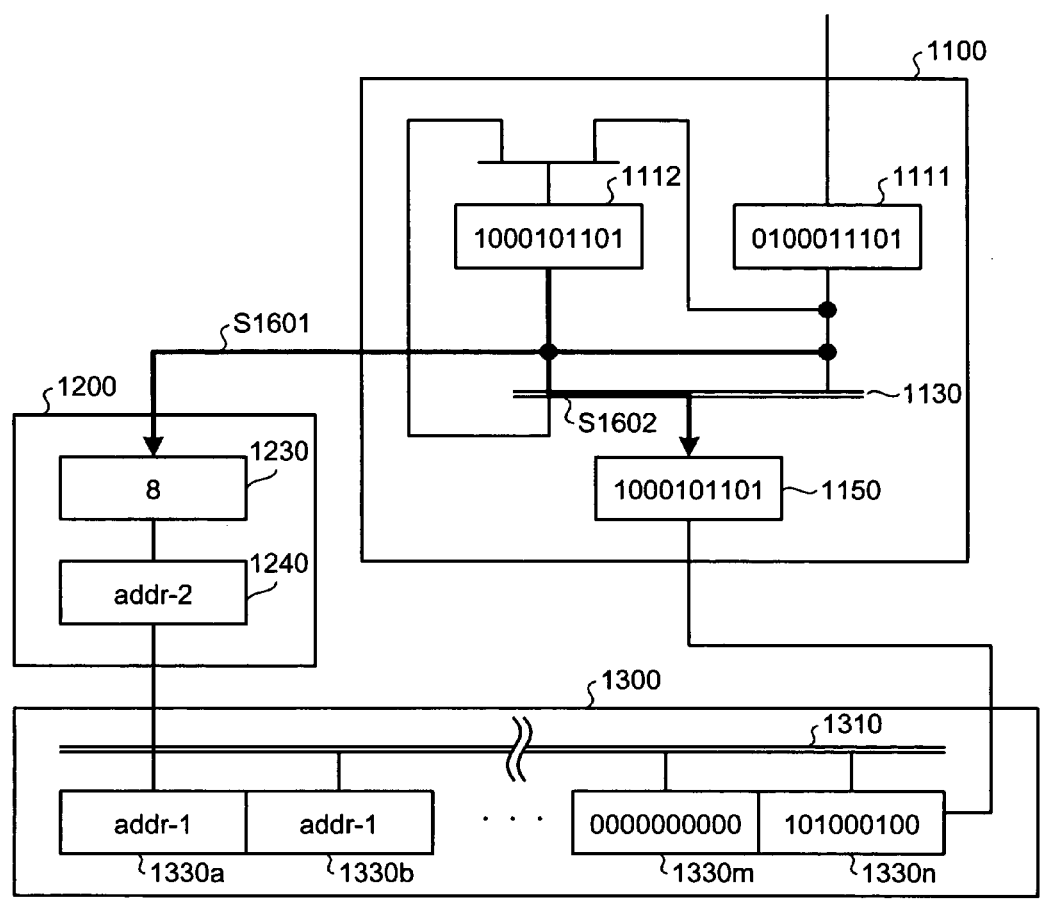

When the symbol data 50 is input as shown in FIG. 14, the cumulative total number stored in the address register 1230 is updated to "8" (step S1601). In this case, since the zero run detection circuit 1120 does not detect the zero run, the data stored in the second input register 1112 is transferred to the temporary register 1150 via the bus for zero run removal 1130 (step S1602).

Figure 15:
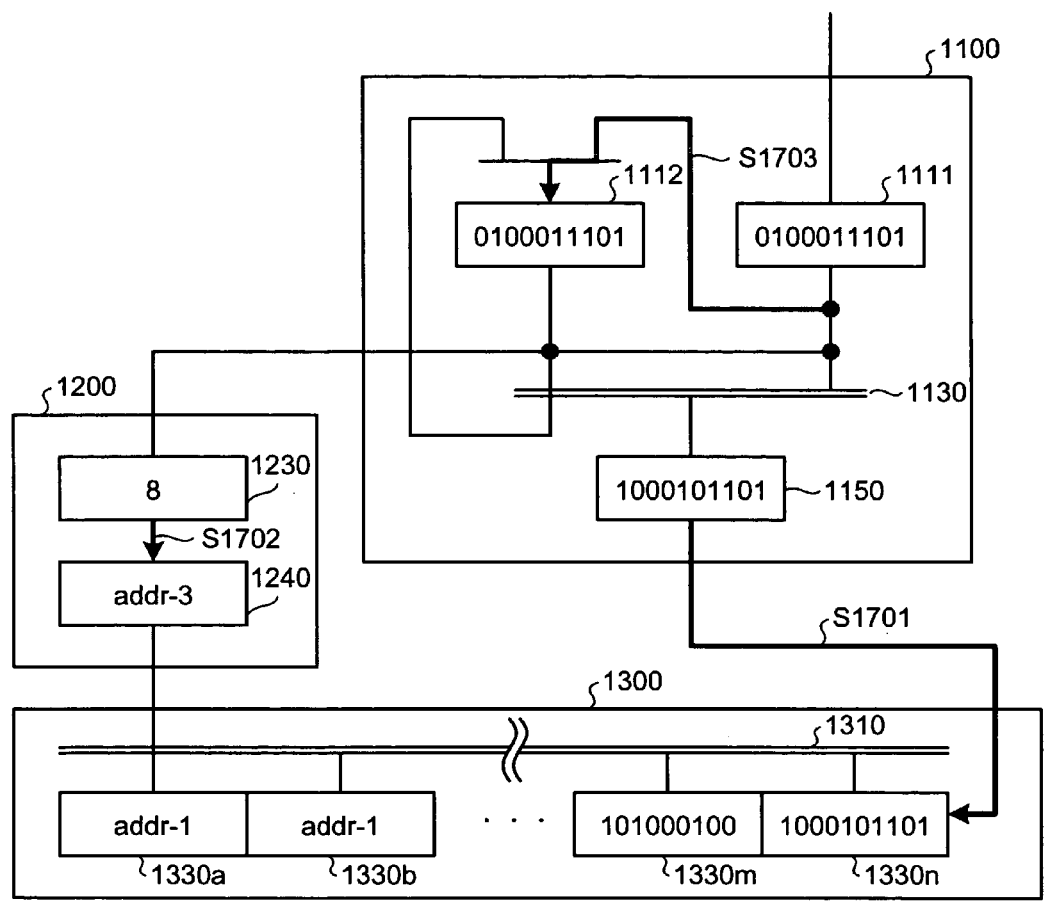

As shown in FIG. 15, the data is further transferred to the register 1330*n* and the data stored in the register 1330*n* is transferred to the register 1330*m* by the shift operation (step S1701). On the other hand, the encoder 1240 newly generates an address of addr-3 in response to the update of the cumulative total number stored in the address register 1230 (step S1702). Then, the data stored in the first input register 1111 is transferred to the second input register 1112 (step S1703).

When another symbol data is input, the symbol data 50 is transferred to the register 1330*n* and the data stored in the register 1330*m* and the register 1330*n* are transferred to the left register by the shift operation. Thus, in the substitution result storage unit 1300, the addresses are stored in the high-level registers and the data with the zero run being removed are stored in the low-level registers.

In the substitution result storage unit 1300, since the address and the data are not always combined with each other, it is necessary to pick out them from the substitution result storage unit 1300 so that the front address and the rear data are continuous. When picking out the last address, it is necessary to substitute the delimiter value by 1.

Figure 16:
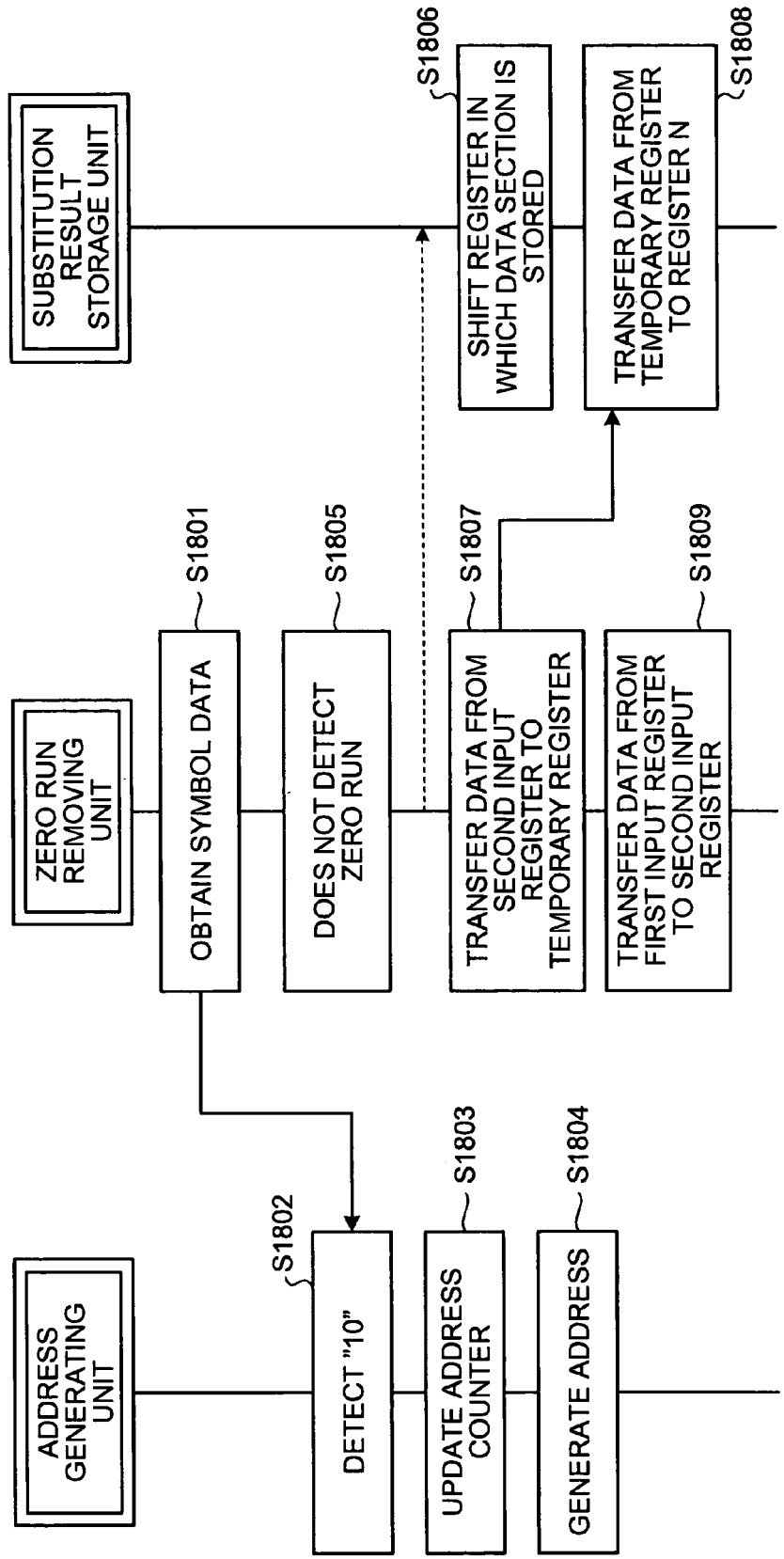
FIG. 16 is a flowchart of the operation when a zero run is not detected.

FIG. 16 is a flowchart of the operation performed by the substitution apparatus 1000 when the zero run is not detected. The zero run removing unit 1100 obtains a symbol data (step S1801), and the address generating unit 1200 detects the number of "10" bit patterns (step S1802). The address generating unit 1200 updates the cumulative total number stored in the address register 1230 (step S1803) if necessary, and generates an address based on the cumulative total number (step S1804).

Since the zero run removing unit 1100 does not detect the zero run (step S1805), the substitution result storage unit 1300 causes the registers (except the registers storing the address) to transfer the data stored therein to the left register (step S1806). The zero run removing unit 1100 then transfers the data stored in the second input register 1112 to the temporary register 1150 (step S1807), and the data is further transferred to the substitution result storage unit 1300 to be stored in the register 1330*n*. The zero run removing unit 1100 then transfers the data stored in the first input register 1111 to the second input register 1112, to finish the continuous processing (step S1808).

Figure 17:
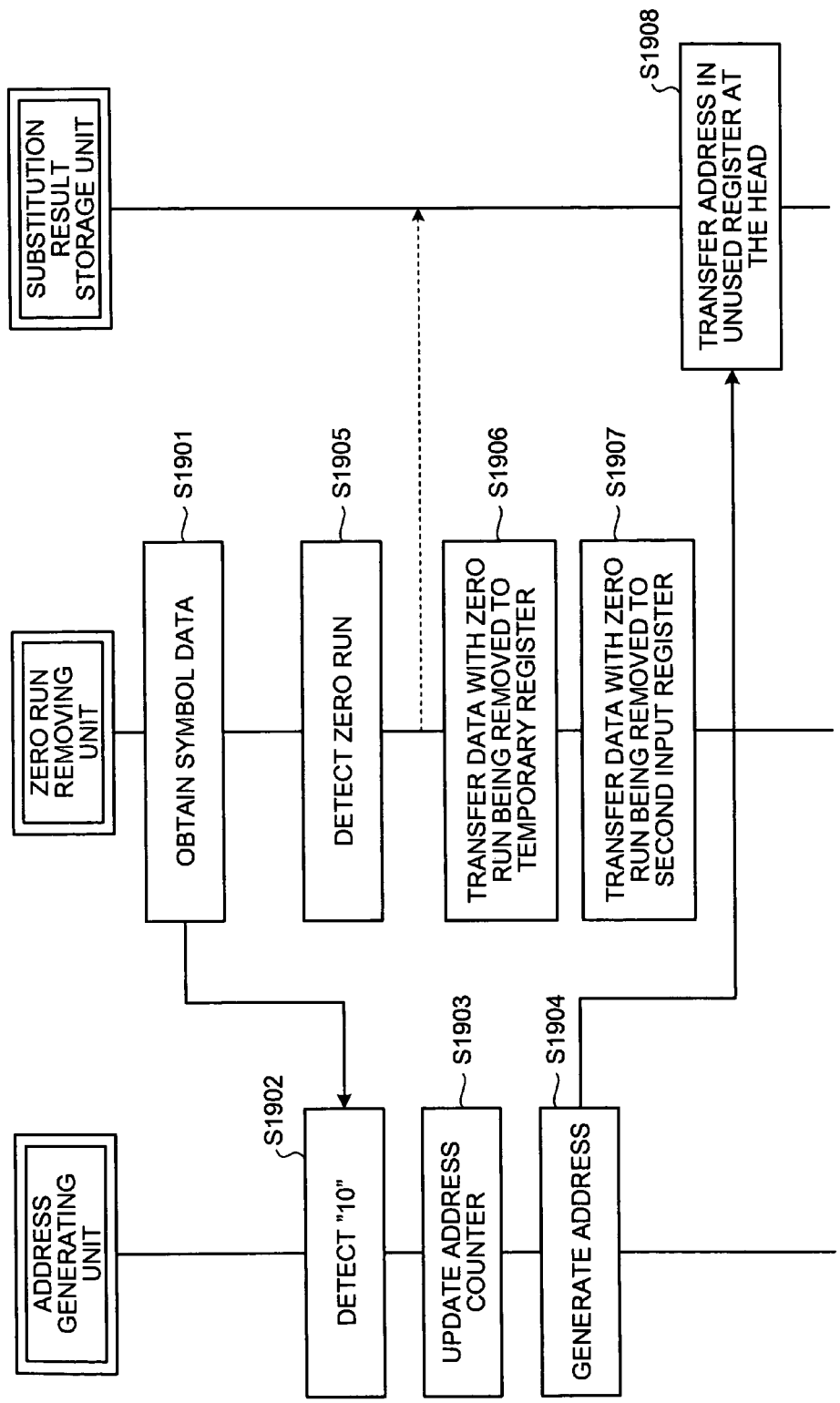
FIG. 17 is a flowchart of the operation when the zero run is detected.

FIG. 17 is a flowchart of the operation performed by the substitution apparatus 1000 when the zero run is detected. The zero run removing unit 1100 obtains a symbol data (step S1901), and the address generating unit 1200 detects the number of "10" bit patterns (step S1902). The address generating unit 1200 updates the cumulative total number stored in the address register 1230 (step S1903) if necessary, and generates an address based on the cumulative total number (step S1904).

Since the zero run removing unit 1100 detects the zero run (step S1905), the data stored in the first input register 1111 and the data stored in the second input register 1112 are transferred, via the bus for zero run removal 1130, to the temporary register 1150 (step S1906) and the second input register 1112 (step S1907). The substitution result storage unit 1300 stores the address generated by the address generating unit 1200 in an unused register at the head, to finish the continuous processing (step S1908).

Figure 18:
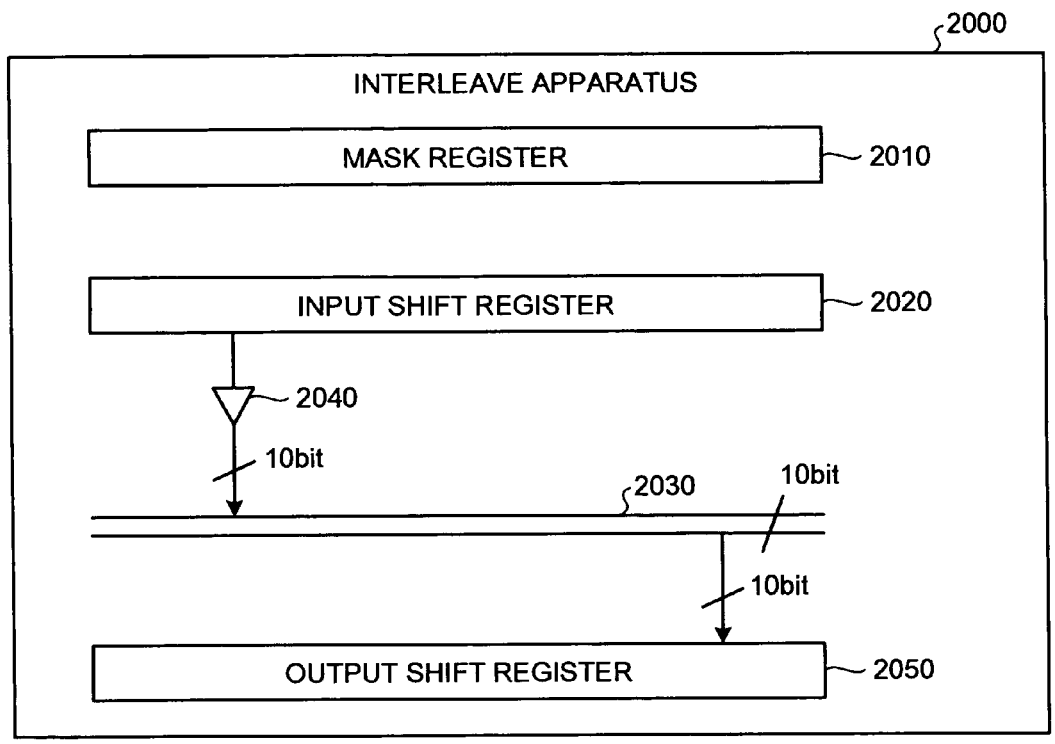
FIG. 18 is a block diagram of an interleave apparatus according to an embodiment of the present invention.

FIG. 18 is a block diagram of an interleave apparatus 2000 according to an embodiment of the present invention. The interleave apparatus 2000 rearranges the substitution result (the bit string with the zero run being removed) so that the bits in the first half of the bit string become even bits, whereas the bits in the latter half of the bit string become even bits, to satisfy the I constraint.

As shown in FIG. 18, the interleave apparatus 2000 has a mask register 2010, an input shift register 2020, an interleave bus 2030, a bus driver 2040, and an output shift register 2050.

The input shift register 2020 stores a bit string to be subjected to the interleave processing. The interleave bus 2030 rearranges the order of bits included in the bit string. The bus driver 2040 controls the interleave bus 2030. The output shift register 2050 stores the bit string after the interleave processing.

The target data to be subjected to the interleave processing is a predetermined number of bits in the first half the bit string (specifically, the bits at the head of the bit string) stored in the input shift register 2020 and a predetermined number of bits in the latter half that are specified by the mask pattern stored in the mask register 2010. The mask register 2010 stores a mask pattern for specifying the position of bits to be subjected to the interleave processing.

FIGS. 19 to 26 are diagrams for explaining an operation performed by the interleave apparatus 2000.

Figure 19:
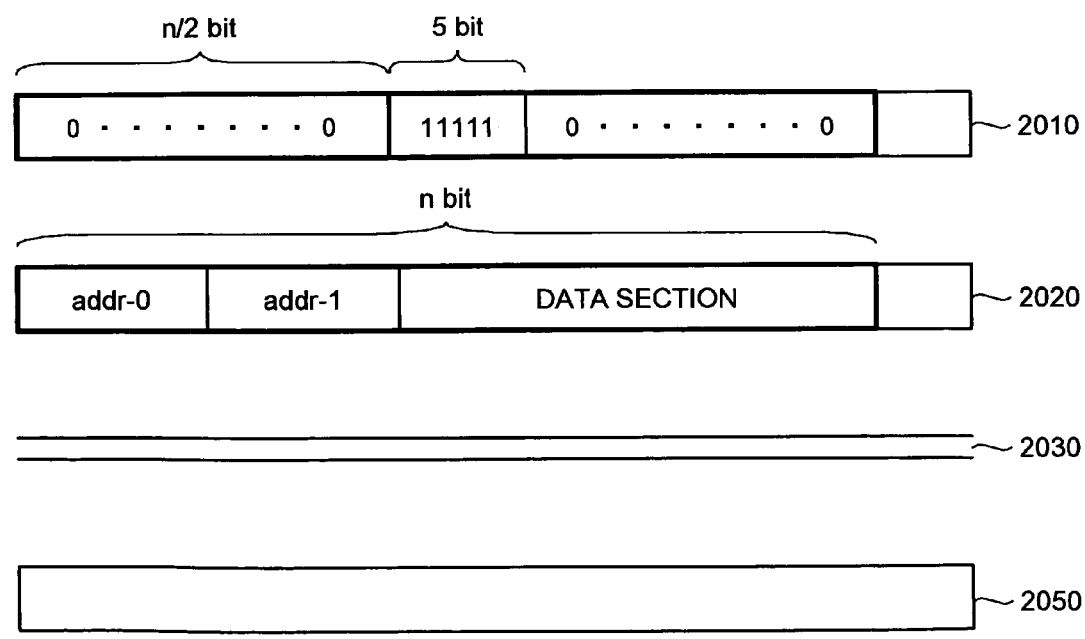
FIGS. 19 to 26 are diagrams for explaining an operation performed by the interleave apparatus.

When the bit string to be subjected to the interleave processing, the bit string including n bits and including two addresses at the head, is input to the input shift register 2020 as shown in FIG. 19, 5 bits (which is half of the bit width of the address) from the n/2+1st bit are set to 1 in the mask register 2010, whereas other bits are initialized to 0.

Figure 20:
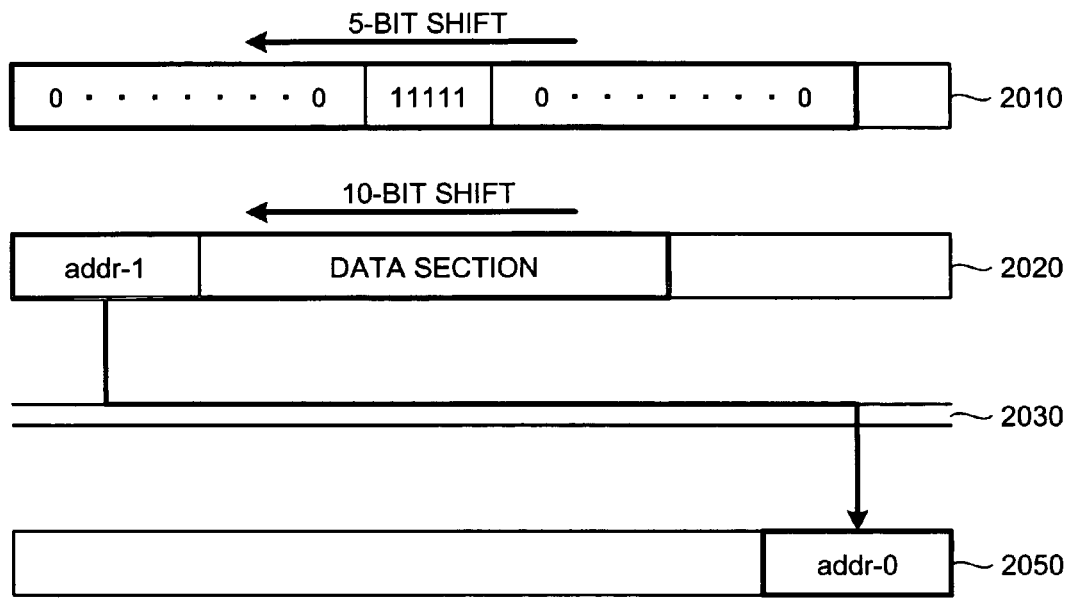

When the first address (addr-0) is transferred to the output shift register 2050 via the interleave bus 2030 as shown in FIG. 20, the input shift register 2020 shifts the bit string by 10 bits (which is the same as the bit width of the address) forward. On the other hand, the mask register 2010 shifts the mask pattern by 5 bits (which is half of the bit width of the address) forward.

Figure 21:
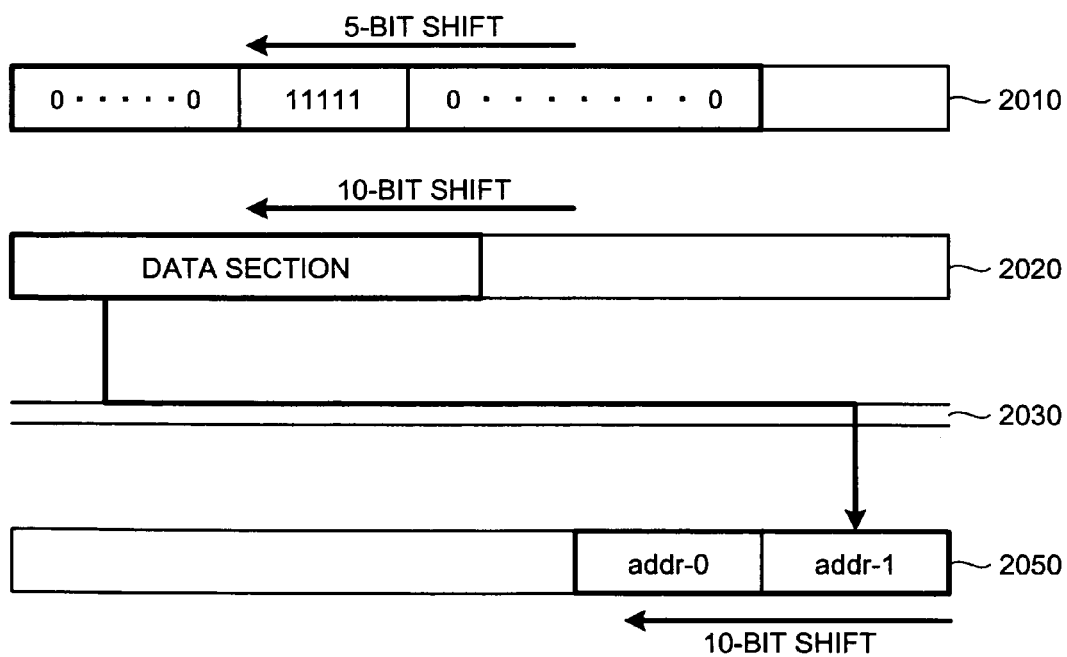

When the second address (addr-1) is transferred to the output shift register 2050 via the interleave bus 2030 as shown in FIG. 21, the input shift register 2020 shifts the bit string by 10 bits forward. On the other hand, the mask register 2010 shifts the mask pattern by 5 bits forward. When the address is transferred, the interleave bus 2030 does not perform the interleave processing.

Figure 22:
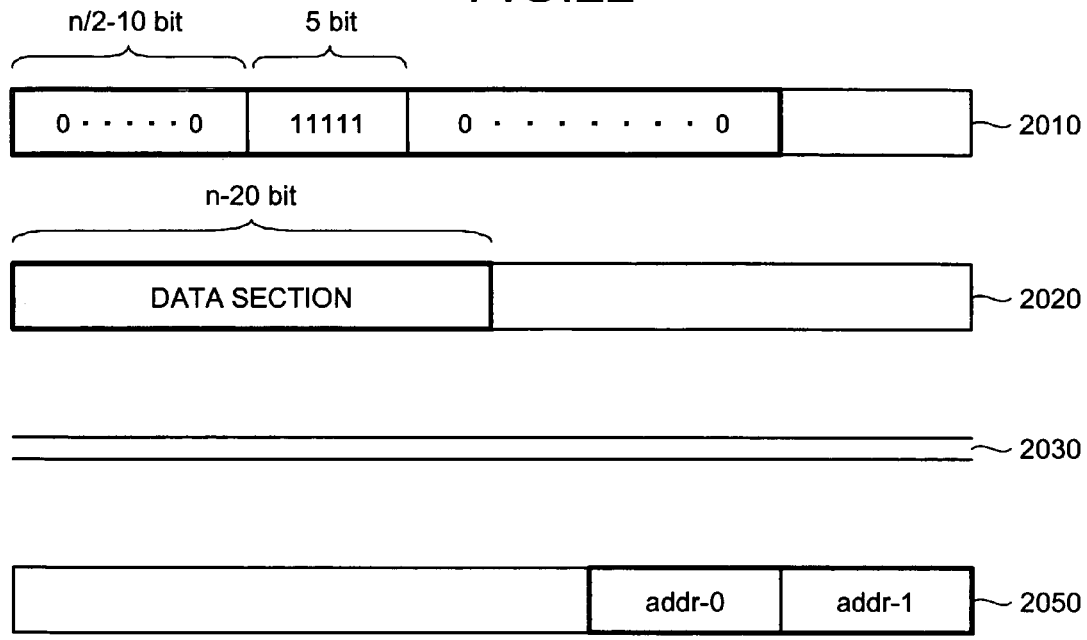

When all the addresses are transferred to the output shift register 2050 as shown in FIG. 22, the number of bits stored in the input shift register 2020 reduces to n−20 bits, since 10-bit shift has been performed twice. On the other hand, there are n/2−10 bits remaining before the bit pattern "11111" in the mask register 2010, since 5-bit shift has been performed twice. In other words, at this time, the bit pattern "11111" corresponds to 5 bits at the beginning of the latter half of the bit string stored in the input shift register 2020.

Figure 23:
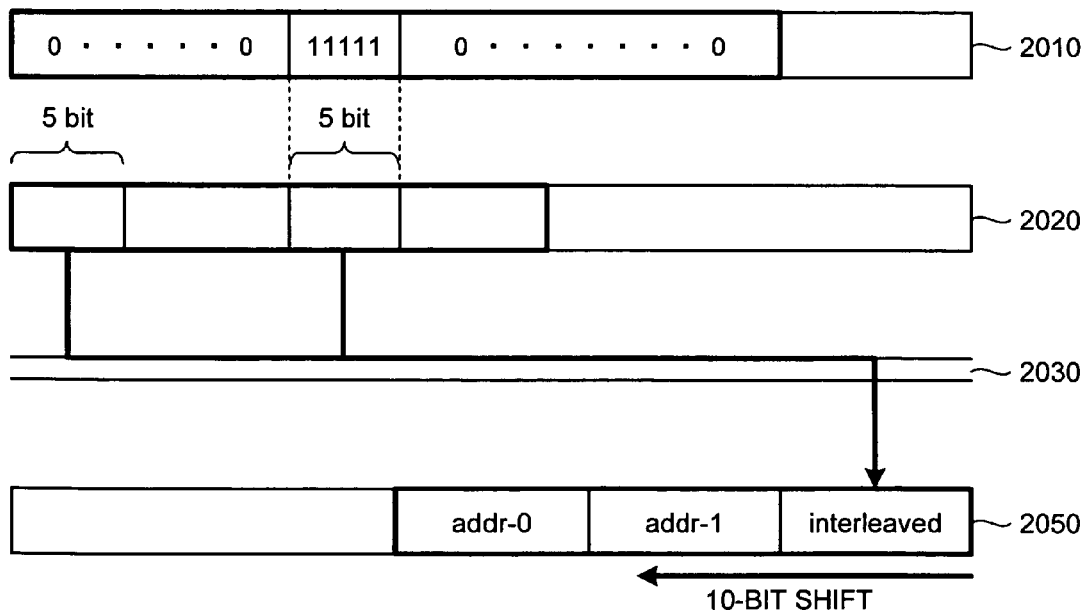

When the input shift register 2020 transfers 5 bits at the beginning of the first half and 5 bits at the beginning of the latter half (in other words, 5 bits corresponding to "1" of the mask pattern) to the output shift register 2050 via the interleave bus 2030 as shown in FIG. 23, the interleave bus 2030 performs the interleave processing to rearrange the bits.

Figure 24:
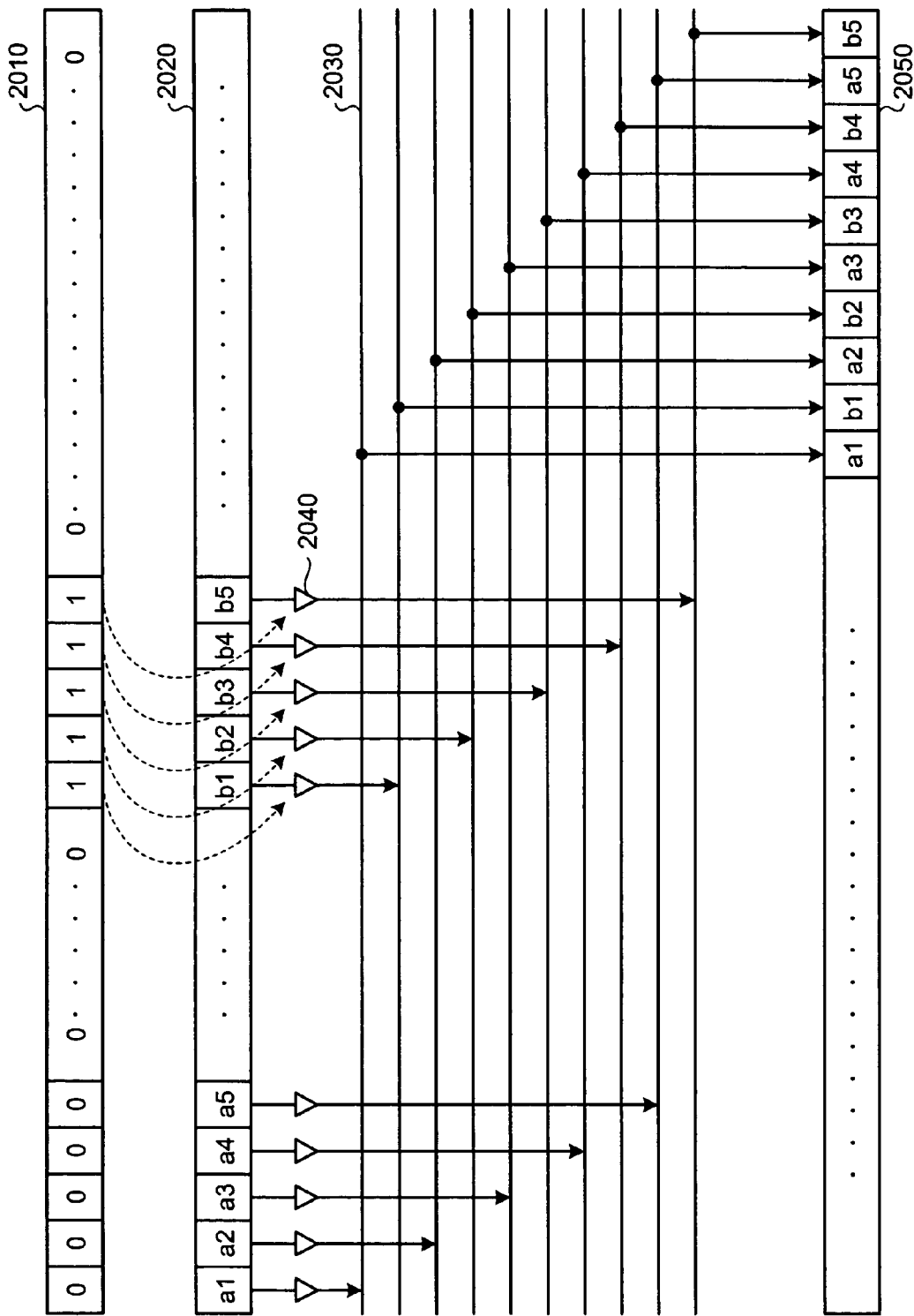

FIG. 24 depicts a mechanism for realizing the interleave processing. The interleave bus 2030 transfers 5 bits at the beginning of the first half so that these bits are mapped to odd bits. On the other hand, the interleave bus 2030 transfers 5 bits at the beginning of the latter half (in other words, 5 bits corresponding to "11111" set in the mask register 2010) so that these bits are mapped to even bits.

According to the encoding method disclosed in Japanese Patent Application No. 2004-117239, since the number of addresses changes for each bit string, the position and the length of data to be subjected to the interleave processing change. As a result, without the bus, a very large circuit is required for the interleave processing.

On the other hand, the interleave apparatus according to the present invention includes the bus that can change a target bit (which bit to be transferred) and/or the mapping destination (transfer destination) optionally, thereby reducing the circuit size.

Figure 25:
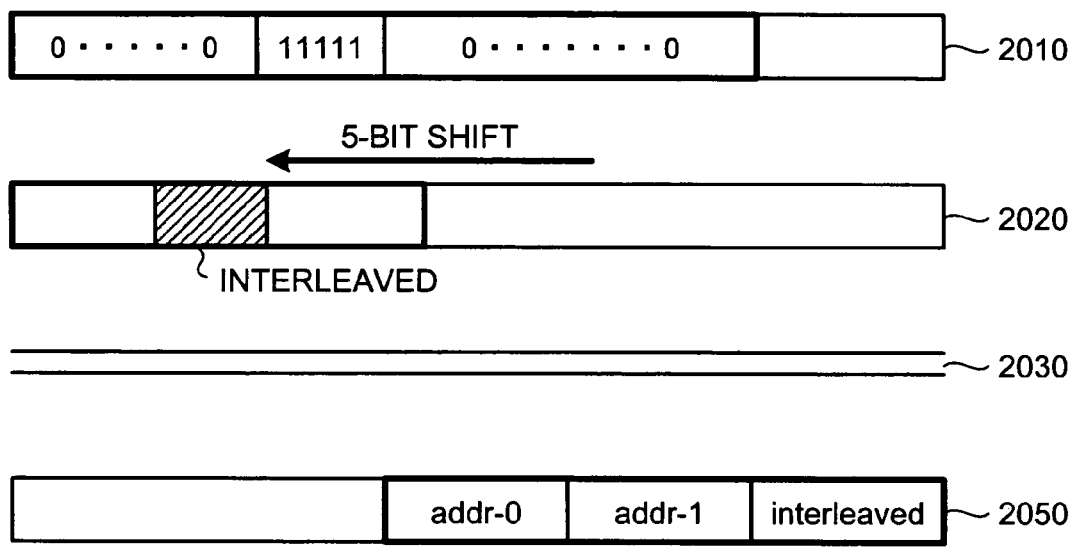

After transferring the bits to the interleave bus 2030, as shown in FIG. 25, the input shift register 2020 shifts the bit string stored therein by 5 bits forward. On the other hand, the mask register 2010 does not perform the shift operation any more.

Figure 26:
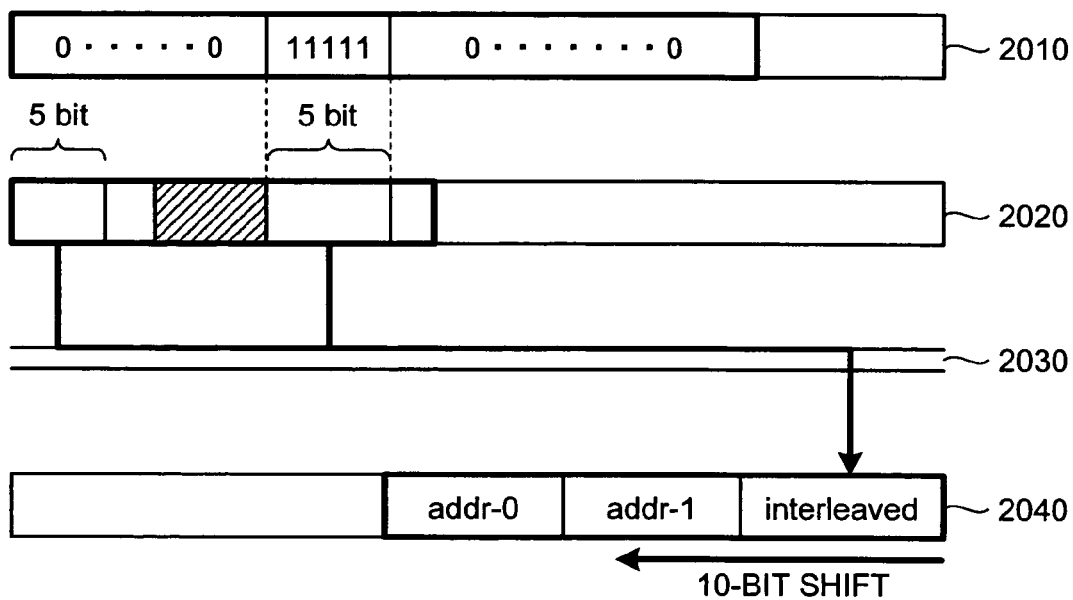

Then, as shown in FIG. 26, 5 bits subsequent to the 5 bits that have been transferred to the output shift register 2050 are subjected to the interleave processing. In this manner, after all addresses are transferred, bus transfer and shift are repeated to complete interleave processing for all data.

Thus, the interleave apparatus 2000 controls the bus transfer for the interleave processing only by the shift operation of the mask register 2010. Accordingly, a complicated control circuit is not required. Furthermore, the interleave apparatus can respond to any change in the bit width of the address by only changing the shift amount, thereby realizing a circuit that does not rely on a code length. Furthermore, the interleave apparatus can satisfy any I constraint only by changing the width of the interleave bus 2030 and the width of bit to be set to 1 in the mask register 2010.

FIG. 27 is a flowchart of the operation performed by the interleave apparatus 2000. The bit width of the address size is assumed to be m bits.

When the bit string to be subjected to the interleave processing is input to the input shift register 2020, m/2 bits from the n/2-th bits in the mask register 2010 are set to 1, and other bits are set to 0 (step S2001).

When an address is stored at the head of the input shift register 2020 (step S2002: Yes), the interleave apparatus 2000 transfers the address to the output shift register 2050 (step S2003), shifts the input shift register 2020 by m bits (step S2004), and shifts the mask register 2010 by m/2 bits (step S2005). Then, the steps after step S2002 onward are repeated.

When no address is stored at the head of the input shift register 2020 (step S2002: No), the interleave apparatus 2000 determines whether there is any data remaining in the input shift register 2020. When there is data (step S2006: Yes), the interleave apparatus 2000 transfers, via the interleave bus 2030, m/2 bits at the beginning of the bit string stored in the input shift register 2020 and m/2 bits corresponding "1" set in the mask register 2010 to the output shift register 2050 (step S2007). Then, the interleave apparatus 2000 shifts only the input shift register 2020 by m/2 bits (step S2008), and the steps after step 2006 onwards are repeated.

While the explanation above is for the encoder, a bus can reduce the circuit size in the decoder. For example, a bus in the decoder rearranges the bits in the interleaved data to perform the operation opposite to the bit operation performed by the interleave bus 2030. Another bus in the decoder transfers a zero run to a specific position of the substituted data, which is obtained by decoding the address, to insert the zero run that has been substituted by the address by the encoder.

According to the present invention, the processing for removing the zero run, which is performed to satisfy G constraint, can be realized with a small circuit (that is, a bus). Furthermore, the processing for transferring the address to a different register can be also realized with a small circuit. Moreover, the storage unit for the result of the substitution can be realized with a small circuit having a simple repeated structure.

According to the present invention, the processing for interleaving the data, which is performed to satisfy I constraint, can be realized with a small circuit (that is, a bus). Furthermore, the bits to be subjected to the interleave processing can be determined by a simple mechanism, that is, by initializing and shifting a mask register.

According to the present invention, the reproduction processing of the interleaved data can be realized with a small circuit (that is, a bus). Furthermore, the reproduction processing of the zero run can be realized with a small circuit (that is, a bus).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An encoder that encodes data using a run-length-limited code, the encoder comprising:
    a zero-run detecting unit that detects a zero run constituting a bit string and having a length longer than a predetermined length; and
    a zero-run removing unit that removes the zero run detected, by transmitting bits before and after the zero-run through a bus so that the bits are combined to each other.

2. The encoder according to claim 1, further comprising an address output unit that outputs an address indicating a position of the zero run detected in the bit string through a bus.

3. The encoder according to claim 2, further comprising a plurality of registers to each of which any one of the address output and a bit string that is stored in an adjacent register.

4. The encoder according to claim 1, further comprising:
    a storage unit that stores a first bit string and a second bit string each of which including a plurality of bits; and
    a bit operation unit that performs a bit operation so that each of the bits in the first bit string and in the second bit string are arranged alternately, by transmitting the bits in the first bit string and in the second bit string through a bus.

5. The encoder according to claim 4, further comprising a mask-pattern shifting unit that shifts a mask pattern for specifying a position of the second bit string in the storage unit every time the bit operation unit performs a bit operation.

6. A method of encoding data using a run-length-limited code, the method comprising:
    detecting a zero run constituting a bit string and having a length longer than a predetermined length; and
    removing the zero run detected, by transmitting bits before and after the zero-run through a bus so that the bits are combined to each other.

7. The method according to claim 6, further comprising outputting an address indicating a position of the zero run detected in the bit string through a bus.

8. The method according to claim 6, further comprising performing a bit operation so that each of the bits in a first bit string and in a second bit string are arranged alternately, by transmitting the bits in the first bit string and in the second bit string through a bus.

9. The method according to claim 8, further comprising shifting a mask pattern for specifying a position of the second bit string in a storage unit every time the bit operation is performed.

* * * * *